(12) United States Patent
Soude et al.

(10) Patent No.: US 7,773,019 B2
(45) Date of Patent: Aug. 10, 2010

(54) DIGITAL-TO-ANALOG CONVERTER

(75) Inventors: Thierry Soude, Marseilles (FR); Joao Pedro Antunes Carreira, Pourriere (FR); Didier Davino, Aix-en-Provence (FR)

(73) Assignee: ATMEL Corporation, San Jose, CA (US)

( * ) Notice: Subject to any disclaimer, the term of this patent is extended or adjusted under 35 U.S.C. 154(b) by 0 days.

(21) Appl. No.: 12/198,726

(22) Filed: Aug. 26, 2008

(65) Prior Publication Data

US 2010/0052963 A1    Mar. 4, 2010

(51) Int. Cl.
    *H03M 1/78* (2006.01)
(52) U.S. Cl. ............... 341/154; 341/118; 341/119; 341/120; 341/121; 341/144
(58) Field of Classification Search ......... 341/118–121, 341/144, 154
    See application file for complete search history.

(56) References Cited

U.S. PATENT DOCUMENTS

| | | | | |
|---|---|---|---|---|
| 5,748,128 A | 5/1998 | Bruccoleri et al. | | |
| 5,808,576 A * | 9/1998 | Chloupek et al. | | 341/144 |
| 6,002,354 A * | 12/1999 | Itoh et al. | | 341/144 |
| 6,166,672 A * | 12/2000 | Park | | 341/145 |
| 6,225,929 B1 * | 5/2001 | Beck | | 341/144 |
| 6,512,471 B2 * | 1/2003 | Marten | | 341/144 |
| 6,617,989 B2 * | 9/2003 | Deak | | 341/144 |
| 6,768,442 B2 | 7/2004 | Meyers et al. | | |
| 6,882,292 B1 | 4/2005 | Bardsley et al. | | |
| 6,885,328 B1 * | 4/2005 | Kao et al. | | 341/144 |
| 6,937,179 B1 * | 8/2005 | Martin | | 341/154 |
| 6,975,261 B1 * | 12/2005 | Isham | | 341/144 |
| 7,095,347 B2 * | 8/2006 | Hirata et al. | | 341/144 |
| 7,259,706 B2 * | 8/2007 | Haurie et al. | | 341/154 |
| 7,468,686 B2 * | 12/2008 | Brubaker | | 341/121 |
| 7,532,142 B1 * | 5/2009 | Voegeli et al. | | 341/154 |
| 7,554,475 B2 * | 6/2009 | Ginosar et al. | | 341/154 |
| 2008/0143570 A1 | 6/2008 | Andersson et al. | | |

* cited by examiner

*Primary Examiner*—Linh V Nguyen
(74) *Attorney, Agent, or Firm*—Fish & Richardson P.C.

(57) ABSTRACT

A PRA-DAC is disclosed. The PRA-DAC is operable to increase its conversion speed.

17 Claims, 3 Drawing Sheets

DIGITAL-TO-ANALOG CONVERTER

TECHNICAL FIELD

The subject matter of this specification is generally related to digital-to-analog converters.

BACKGROUND

A digital-to-analog converter (DAC) is a device for converting a digital code to an analog signal. For example, a DAC can convert an 8-bit digital signal into an output voltage or current having an amplitude representing the digital code. Two common examples of DACs are the "R-string" DAC and the "R-2R ladder" DAC. Another example is the parallel resistors architecture (PRA) DAC. Advantages of the PRA-DAC over the "R-string" DAC and the "R-2R ladder" DAC include that the PRA-DAC has a constant output impedance and inherent monotonicity compared to "R-2R ladder" DACs.

When an input (e.g., a digital code) is changed, the output (e.g., an analog signal) of a DAC settles to a value after a delay called a settling time. The settling time depends on the output resistance Rout of the DAC and a capacitive load CL at the output of the DAC. In particular, the settling time depends on a time constant that can be defined by the product of Rout and CL. The settling time can limit a conversion speed of the DAC.

SUMMARY

A PRA-DAC is disclosed. The PRA-DAC is operable to increase its conversion speed.

An advantage of the PRA-DAC is that its conversion speed can be increased (i) without affecting resistor matching, thereby maintaining the linearity of the PRA-DAC; and (ii) without increasing power consumption during a period of fine settling.

DESCRIPTION OF DRAWINGS

Like reference symbols in the various drawings indicate like elements.

DETAILED DESCRIPTION

Example PRA-DAC

Figure 1:
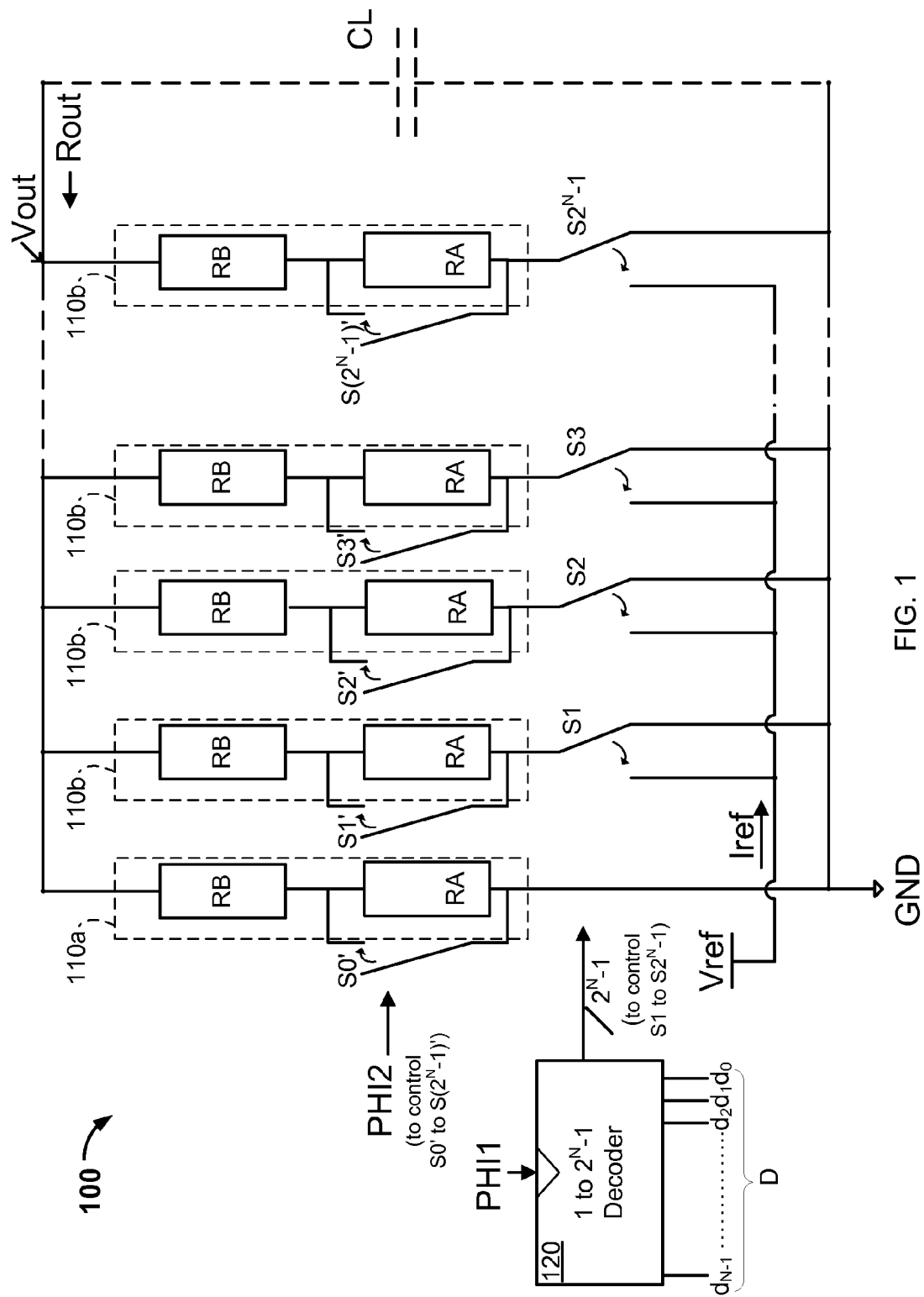
FIG. 1 is a schematic circuit diagram illustrating an example PRA-DAC.

FIG. 1 is a schematic circuit diagram illustrating an example PRA-DAC 100. In this example, the PRA-DAC 100 is an N-bit DAC that receives a digital input D having N bits (e.g., $d_0, d_1, \ldots, d_{N-1}$). Based on a received D, the PRA-DAC 100 generates an analog voltage output Vout. In one example, Vout can increase monotonically with D. For example, if $D_1 > D_2$, $Vout_{D1} > Vout_{D2}$.

The PRA-DAC 100 includes a resistive network. The resistive network includes $2^N$ sets of parallel resistive elements 110. In some implementations, a capacitive load CL can be coupled to the resistive network at the output of the PRA-DAC 100. In this example, each of the sets of parallel resistive elements 110 includes a resistive element RA and a resistive element RB. The sets of parallel resistive elements 110 have substantially the same resistance R=RA+RB. One of the sets of parallel resistive elements 110a is connected to ground GND. $2^N-1$ of the sets of parallel resistive elements 110b are coupled to a first switch network. The first switch network includes switches S1, S2, ..., $S2^N-1$. S1 to $S2^N-1$ can control the $2^N-1$ sets of parallel resistive elements 110b to be connected either to a reference voltage Vref or to GND.

S1 to $S2^N-1$ connect the sets of parallel resistive elements 110b based on a control word generated by a decoder 120. For example, S1 to $S2^N-1$ can be configured so that a switch connects a connected resistor to Vref if a control signal representing logic 1 is received, and the switch connects the connected resistor to GND if a control signal representing logic 0 is received. Other reference levels can also be used. In some implementations, a switch can be a transistor that is biased to behave like a switch. Other implementations are possible.

The decoder 120 generates a $2^N-1$ bits control word based on the received D. In some implementations, each control bit in the control word corresponds to one of the switches of S1 to $S2^N-1$. Based on the corresponding control bit, S1 to $S2^N-1$ can connect the sets of parallel resistive elements 110b to Vref or GND. In some implementations, the control word can be a decoded representation of D. For a given D (e.g., D is an integer between 0 and $2^N-1$), D of the $2^N-1$ control bits may be at logic 1 and $2^N-D$ of the control bits may be at logic 0. In some implementations, because the decoder 120 is configured to generate D of the $2^N-1$ control signals at logic 1, D of the sets of parallel resistive elements 110 are connected to Vref and $2^N-D$ resistors are connected to GND.

Accordingly, the PRA-DAC 100 can generate Vout based on a voltage division between the sets of parallel resistive elements 110 connected to Vref and the sets of parallel resistive elements 110 connected to GND. In some implementations, the equivalent resistance between Vref and Vout is approximately $$\frac{R}{D},$$

and the equivalent resistance between Vout and GND is approximately $$\frac{R}{2^N - D}.$$

The PRA-DAC 100 can generate Vout based on D (Vout(D)) according to the following equation:

$$Vout(D) = D \cdot \frac{Vref}{2^N}.$$

The PRA-DAC 100 can generate Vout(D) that is substantially monotonic to D. For example, as D is incremented by one (e.g., increment from D to D+1), an additional resistive element is connected to Vref. Thus, Vout(D) is less than Vout(D+1). In some implementations, the monotonic property of the PRA-DAC 100 is substantially independent of the quality of the matching of the sets of parallel resistive elements 110. For example, if the sets of parallel resistive elements 110 are poorly matched, resulting in highly varied resistance across the sets of parallel resistive elements 110, the monotonic property of the PRA-DAC 100 can still be substantially preserved because more resistance is still connected to Vref.

As shown, the PRA-DAC 100 draws a reference current Iref from Vref. In this example, Iref flows first from a node at Vref to a node at Vout through D sets of parallel resistive elements 110, and then from Vout to GND through $2^N$–D sets of parallel resistive elements 110. Depending on D, Iref(D) can be expressed as:

$$Iref(D) = \frac{D}{R} \cdot (Vref - Vout(D)), \text{ and}$$

$$Iref(D) = \frac{2^N - D}{R} \cdot Vout(D).$$

From the above equations, Iref(D) can be expressed as:

$$Iref(D) = \frac{Vref}{\frac{R}{D} + \frac{R}{2^N - D}}.$$

By rearranging the above equation, Iref(D) can be expressed as:

$$Iref(D) = D \cdot (2^N - D) \cdot \frac{Vref}{2^N \cdot R}, \text{ or}$$

$$Iref(D) = D \cdot (2^N - D) \cdot \frac{LSB}{R},$$

where $$LSB = \frac{Vref}{2^N}.$$

Note that Iref(D) is a second order polynomial depending on D. Iref(D) is at a minimum at D=0. The minimum value of Iref(D) is:

$$I_{min} = Iref(D=0) = 0.$$

At mid-scale ($2^{N-1}$), Iref(D) increases to a maximum. The maximum value of Iref(D) is:

$$I_{max} = Iref(D = 2^{N-1}) = 2^{N-2} \cdot \frac{Vref}{R} = 2^{2N-2} \cdot \frac{LSB}{R}.$$

After mid-scale, Iref(D) symmetrically decreases to:

$$Iref(D = 2^N - 1) = \frac{2^N - 1}{2^N} \cdot \frac{Vref}{R}.$$

The output resistance of the PRA-DAC 100 at D (Rout(D)) includes the resistance $$\frac{R}{D}$$

in parallel with $$\frac{R}{2^N - D}.$$

Solving for the equivalent resistance, Rout(D) can be expressed as $$Rout(D) = \frac{R}{2^N},$$

where Rout is independent of D.

Settling Time and Conversion Speed

When D changes, Vout(D) settles to a value (e.g., a final value) after a delay called the settling time $t_{SETTLE}$. For example, Vout(D) can be considered to have settled to its final value, when Vout(D) is less than $$\frac{LSB}{2}$$

away from $$D \cdot \frac{Vref}{2^N} \left( \text{e.g., } \left| Vout(D) - \left( D \cdot \frac{Vref}{2^N} \right) \right| < \frac{LSB}{2} \right).$$

Because a conversion speed $f_S$ of the PRA-DAC 100 (e.g., a rate at which D changes) depends on $t_{SETTLE}$, $f_S$ cannot be greater than $$\frac{1}{t_{SETTLE}}.$$

For example, depending on the rate at which D changes, Vout(D) at $$T_S = \frac{1}{f_S}$$

(e.g., a period of D) can be greater than $$\frac{LSB}{2}$$

away from $$D \cdot \frac{Vref}{2^N} \left( \text{e.g., } \left| Vout(D) - \left( D \cdot \frac{Vref}{2^N} \right) \right| > \frac{LSB}{2} \right).$$

Thus, a maximum value of $f_S$ can be expressed as:

$$f_{S\_MAX} = \frac{1}{t_{SETTLE}}.$$

As explained previously, $t_{SETTLE}$ depends on $\tau_{DAC}$. $\tau_{DAC}$ can be expressed as:

$$\tau_{DAC} = Rout \cdot CL = \frac{R}{2^N} \cdot CL.$$

For a first order system, Vout(D) settles exponentially and can be expressed as:

$$Vout(t) = Vout(t=0) + [Vout(t=\infty) - Vout(t=0)] \cdot \left[1 - \exp\left(-\frac{t}{\tau_{DAC}}\right)\right].$$

Vout(t) at $t=\tau_{DAC}$ can be expressed as:

$$Vout(t=\tau_{DAC}) = Vout(t=0) + [ \quad \text{Expression [1]}$$
$$Vout(t=\infty) - Vout(t=0)] \cdot \left[1 - \exp\left(-\frac{\tau_{DAC}}{\tau_{DAC}}\right)\right].$$

Simplifying, Vout($t=\tau_{DAC}$) can be expressed as:

$$Vout(t=\tau_{DAC}) \approx Vout(t=0) + 0.63 \cdot [Vout(t=\infty) - Vout(t=0)].$$

For a first order system, the relationship between $t_{SETTLE}$ and $\tau_{DAC}$ can also depend on N. Again, Vout(D) can be considered to have settled to its final value when Vout(D) is less than $$\frac{LSB}{2}$$

away from $$D \cdot \frac{Vref}{2^N}.$$

This condition can also be expressed as:

$$Vout(t=\infty) - Vout(t=t_{SETTLE}) < \frac{LSB}{2} = \frac{Vref}{2^{N+1}}. \quad \text{Expression [2]}$$

Generally, Vout(t=0)=0 and Vout(t=∞)=Vref. Using Expression [1], Vout(t) can be expressed as:

$$Vout(t) = Vref \cdot \left[1 - \exp\left(-\frac{t}{\tau_{DAC}}\right)\right]. \quad \text{Expression [3]}$$

Using Expression [3] and Expression [2], the condition can be expressed as:

$$Vref - Vref \cdot \left[1 - \exp\left(-\frac{t_{SETTLE}}{\tau_{DAC}}\right)\right] < \frac{Vref}{2^{N+1}},$$

or $$\exp\left(-\frac{t_{SETTLE}}{\tau_{DAC}}\right) < \frac{1}{2^{N+1}}.$$

Using the neperian logarithm, the condition can be expressed as:

$$\ln\left[\exp\left(-\frac{t_{SETTLE}}{\tau_{DAC}}\right)\right] < \ln\left[\frac{1}{2^{N+1}}\right],$$

or $$-\frac{t_{SETTLE}}{\tau_{DAC}} < -(N+1) \cdot \ln(2).$$

Therefore, the condition can be expressed as:

$$t_{SETTLE} > (N+1) \cdot \ln(2) \cdot \tau_{DAC},$$
$$t_{SETTLE} > (N+1) \cdot \ln(2) \cdot Rout \cdot CL,$$

or $$t_{SETTLE} > (N+1) \cdot \ln(2) \cdot \frac{R}{2^N} \cdot CL.$$

Conversion Speed of the Example PRA-DAC

As discussed previously, $f_S$ depends on $t_{SETTLE}$, $t_{SETTLE}$ depends on $\tau_{DAC}$, and $\tau_{DAC}$ depends on Rout. Therefore $t_{SETTLE}$ can be reduced by reducing Rout of the PRA-DAC 100. Permanently reducing Rout can result in increased power consumption that can be proportional to the reduction in Rout. Furthermore, reducing resistances of resistive elements in the PRA-DAC, for example, can decrease the quality of resistor matching (e.g., matching actual resistance values among the sets of parallel resistive elements 110, including the actual resistance values of RA and RB). For example, in various embodiments, the actual resistance values of the resistors RA (e.g., RA coupled to S1, RA coupled to S2, and RA coupled to S3, etc.) are preferably matched, or substantially the same value. As another example, the actual resistance values of the resistors RB (e.g., RB coupled to S1', RB coupled to S2', and RB coupled to S3', etc.) are preferably matched, or substantially the same value.

If the resistances of the resistive elements are reduced, the resistor matching can become, for example, more susceptible to parasitic resistances (e.g., parasitic resistances of switches and metal routings between resistors). Because the actual resistances of the sets of parallel resistive elements 110 may not be substantially the same value, voltage division between the sets of parallel resistive elements 110 connected to Vref, for example, can vary, thereby affecting Vout. The linearity of the PRA-DAC 100 can be decreased because the linearity depends on the resistor matching.

Referring to FIG. 1, the PRA-DAC 100 is operable to temporarily reduce Rout. A first input signal PHI1 (e.g., a clock signal), received at the decoder 120, can set $f_S$. The resistive elements RA in the sets of parallel resistive elements 110 can be coupled to a second switch network. The second switch network includes switches S0', S1', S2', ..., S($2^N$–1)'. The second switch network is operable to short the resistive elements RA in response to a second input signal PHI2. For example, when PHI2 is high (e.g., represented by logic 1), the second switch network can short the resistive elements RA. Alternatively, when PHI2 is low (e.g., represented by logic 0), the second switch network is open. Other reference levels can be used.

When the second switch network is open, the sets of parallel resistive elements 110 have a resistance R=RA+RB. Shorting the resistive elements RA causes the sets of parallel resistive elements 110 to have a resistance R=RB. Because $$Rout(D) = \frac{R}{2^N},$$

Rout is reduced. Thus, $\tau_{DAC}$ and $t_{SETTLE}$ are reduced, and $f_S$ can be increased.

Figure 2:
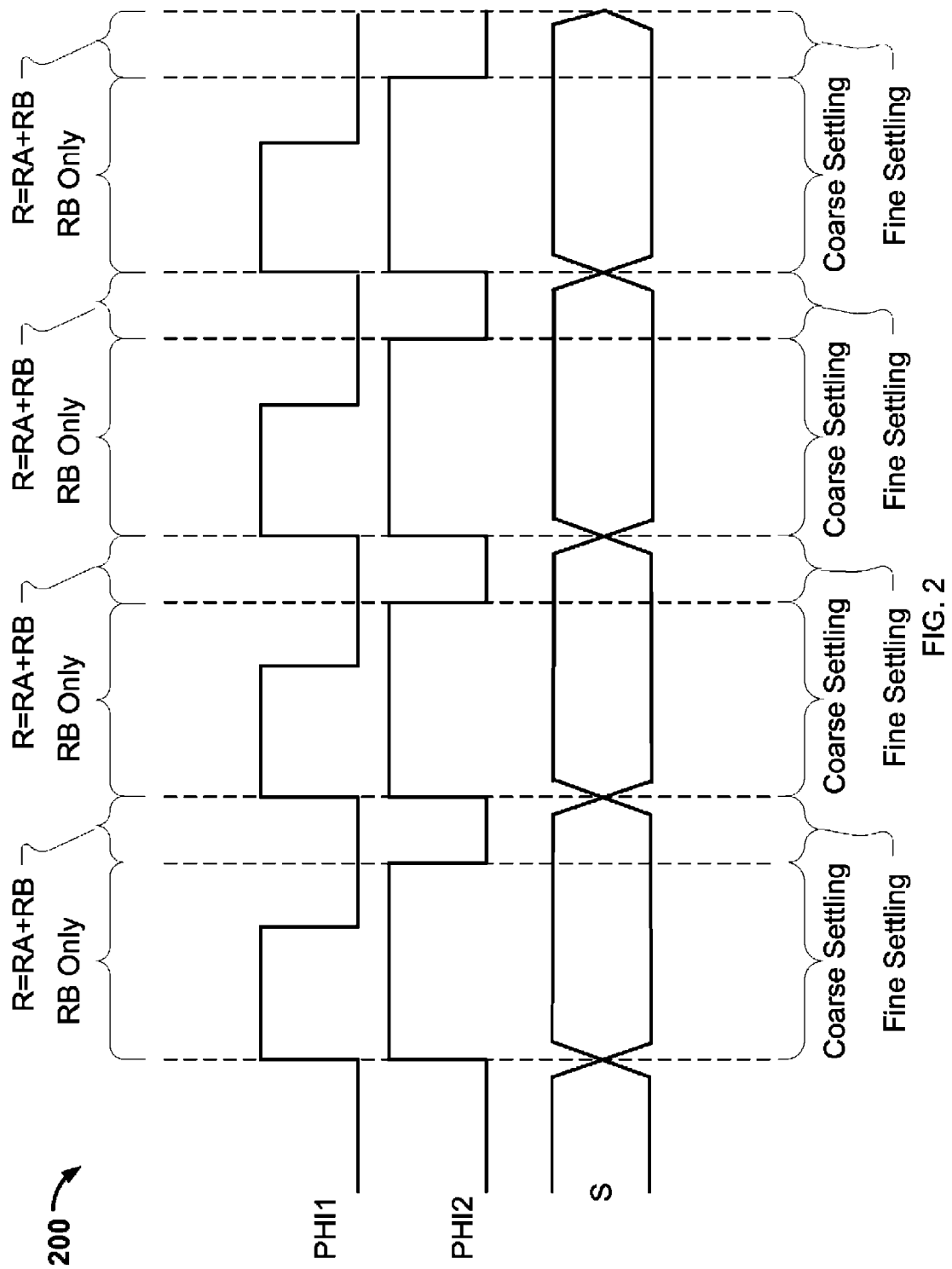
FIG. 2 is a diagram including example resistance values of adjustable resistive elements in the PRA-DAC of FIG. 1.

FIG. 2 is a diagram 200 including example resistance values of adjustable resistive elements in the PRA-DAC of FIG. 1. The diagram 200 also includes a control signal S that is used to operate (e.g., open and close) S1 to S$2^N$–1 of FIG. 1. As shown in FIG. 2, PHI1 can be used to temporarily reduce Rout.

PHI2 can depend on PHI1. In particular, PHI2 can be high for a first portion of a clock period of PHI1. The first portion can correspond to a period of coarse settling, where R=B. During coarse settling, Vout(t) settles with a corresponding time constant $$\tau_{DAC1} = \frac{RB}{2^N \cdot CL}.$$

The first portion of PHI2 can be followed by a second portion of the clock period of PHI1, where PHI2 is low. The second portion corresponds to a period of fine settling, where R=RA+RB. During fine settling, Vout(t) settles with a corresponding time constant $$\tau_{DAC2} = \frac{RA + RB}{2^N \cdot CL}.$$

Because Rout is temporarily reduced during the first portion of the clock period of PHI1, $\tau_{DAC}$ and $t_{SETTLE}$ can be reduced during the first portion of the clock period of PHI1. Furthermore, because R can equal (RA+RB) during a second portion of the clock period of PHI1, the linearity of the PRA-DAC 100 can be maintained during the second portion of the clock period of PHI1. Furthermore, increased power consumption of the PRA-DAC 100 can be limited to the first portion of the clock period of PHI1.

Figure 3:
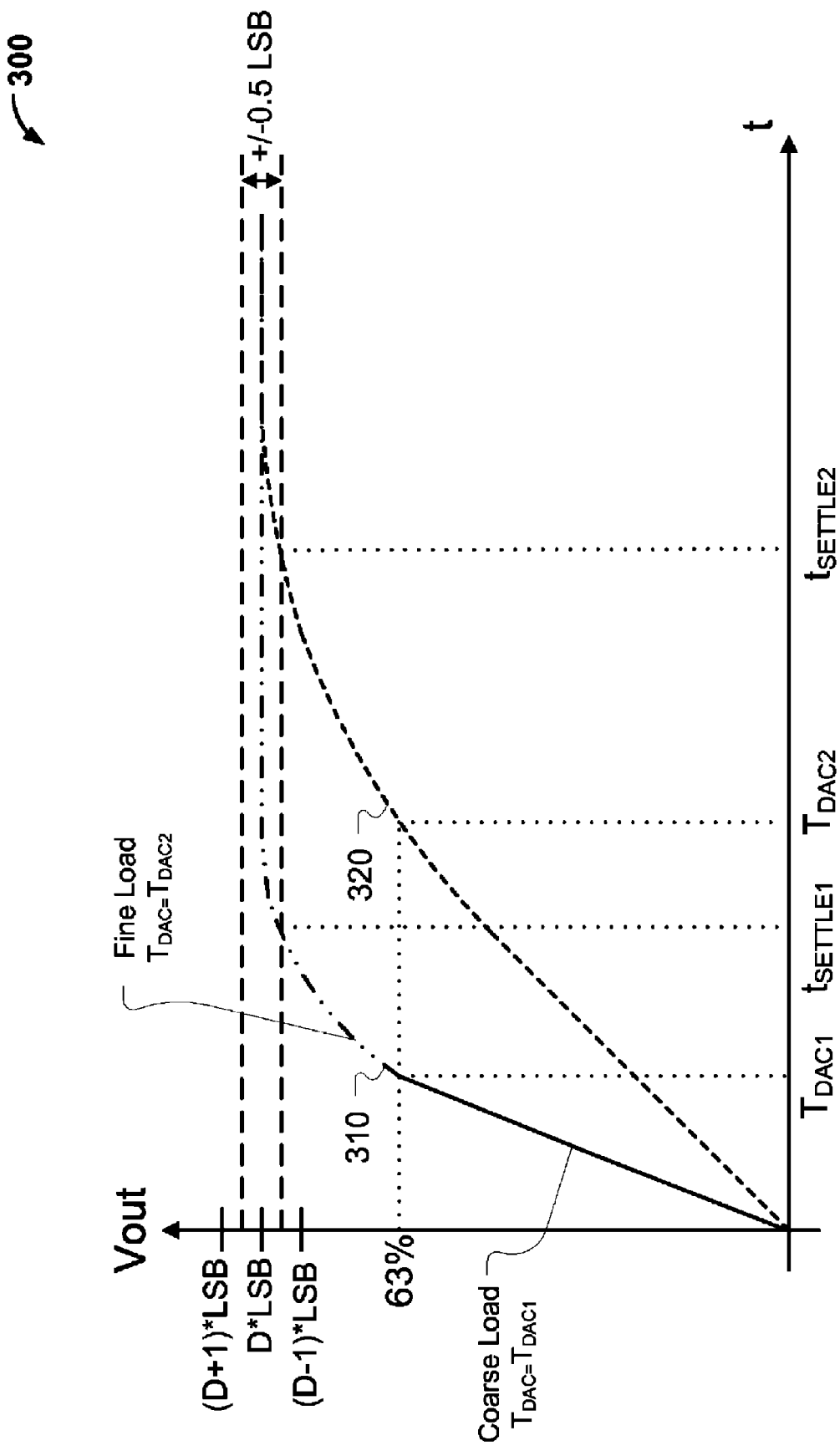
FIG. 3 is a diagram illustrating example settling times.

FIG. 3 is a diagram 300 illustrating example settling times. In particular, FIG. 3 illustrates example settling times for a PRA-DAC where $$RB = \frac{1}{2}RA.$$

Therefore, $$\tau_{DAC1} = \frac{RB}{2^N \cdot CL}$$

and $$\tau_{DAC2} = \frac{RA + RB}{2^N \cdot CL} = \frac{3 \cdot RB}{2^N \cdot CL}.$$

When Rout is temporarily reduced, Vout settles to approximately 63% of a final value at t=$\tau_{DAC1}$ (e.g., as illustrated by plot 310) approximately three times faster than when Rout is not temporarily reduced (e.g., as illustrated by plot 320 at t=$\tau_{DAC2}$). In addition, when Rout is temporarily reduced, $t_{SETTLE1} < t_{SETTLE2}$.

In the example, PHI2 has been configured so that a period of coarse settling equals to $\tau_{DAC1}$. After the coarse settling, a period of fine settling follows that corresponds to $\tau_{DAC2}$. In some implementations, PHI2 can be generated so that PHI2 is high for the entire clock period of PHI1. Other configurations are possible.

Although one implementation of a PRA-DAC (e.g., the PRA-DAC 100 of FIG. 1) is described, other implementations are also possible. For example, the PRA-DAC can include other architectures that allow the PRA-DAC to temporarily reduce Rout. For example, other types of resistive elements (e.g., transistors) can be used. As another example, the resistive elements of the PRA-DAC can be adjustable resistive elements (e.g., variable resistors). As another example, the sets of parallel resistive elements 110 of FIG. 1 can alternatively include switched resistors in parallel.

A number of implementations of the invention have been described. Nevertheless, it will be understood that various modifications may be made without departing from the spirit and scope of the invention. Accordingly, other implementations are within the scope of the following claims.

What is claimed is:

1. A digital to analog converter (DAC) comprising:
a resistive network including a set of resistive elements, the resistive network having a first resistance for a first portion of a settling time of the DAC determined at least by a capacitive load and the first resistance, and a second resistance for a second portion of the settling time of the DAC determined at least by the capacitive load and the second resistance, wherein the second resistance is greater than the first resistance; and
a first switch network coupled to the set of resistive elements and operable to select one or more resistive elements from the set of resistive elements in response to a first input signal and a control signal.

2. The DAC of claim 1, wherein the second portion follows the first portion.

3. The DAC of claim 1, wherein the set of resistive elements includes subsets of resistive elements that each include a first resistive element coupled in series to a second resistive element, the second resistive element coupled in parallel to a second switch network that is operable to receive a second input signal and short the second resistive element for the first portion of the settling time.

4. The DAC of claim 1, wherein the set of resistive elements includes a first subset of resistive elements and a second subset of resistive elements, the second subset of resistive elements coupled to a second switch network that is operable to switch the resistive network between the first resistance and the second resistance in response to a second input signal.

5. The DAC of claim 4, wherein the second input signal depends on the first input signal.

6. The DAC of claim 1, wherein the resistive network is operable to be coupled to the capacitive load.

7. The DAC of claim 6, wherein the settling time of the DAC is equal to a product of an output resistance of the DAC and a capacitance of the capacitive load.

8. The DAC of claim 1, further comprising:
a decoder coupled to the first switch network and operable to generate the control signal.

9. A method comprising:
selecting one or more resistive elements from a first set of resistive elements in a resistive network of a digital-to-analog converter (DAC), in response to a first input signal and a control signal; and
switching a resistance of the resistive network from a first resistance for a first portion of a settling time of the DAC determined at least by a capacitive load and the first resistance to a second resistance for a second portion of the settling time of the DAC determined at least by a capacitive load and the second resistance, wherein the second resistance is greater than the first resistance.

10. The method of claim 9, wherein the second portion follows the first portion.

11. The method of claim 9, wherein switching a resistance of the resistive network comprises:
shorting a subset of resistive elements in the first set of resistive elements in response to a second input signal.

12. The method of claim 9, wherein the settling time of the DAC is equal to a product of an output resistance of the DAC and a capacitance of the capacitive load coupled to the DAC.

13. A digital to analog converter (DAC) comprising:
a resistive network including a first set of resistive elements; and
a first switch network coupled to the resistive network and operable to select one or more resistive elements from the first set of resistive elements in response to a first input signal and a control signal,
wherein the first set of resistive elements has an adjustable resistance that is operable to temporarily reduce an output resistance of the DAC, and
wherein the first set of resistive elements includes subsets of resistive elements that each include a first resistive element coupled in series to a second resistive element, the second resistive element coupled in parallel to a second switch network that is operable to receive a second input signal and short the second resistive element.

14. The DAC of claim 13, wherein the resistive network is operable to be coupled to a capacitive load.

15. The DAC of claim 14, wherein a settling time of the DAC is equal to a product of the output resistance of the DAC and a capacitance of the capacitive load.

16. The DAC of claim 13, wherein the first set of resistive elements includes resistive elements having a variable resistance.

17. The DAC of claim 13, further comprising:
a decoder coupled to the first switch network and operable to generate the control signal.

* * * * *